(12) United States Patent
Kim

(10) Patent No.: US 8,300,199 B2
(45) Date of Patent: Oct. 30, 2012

(54) FLEXIBLE PRINTED CIRCUIT BOARD AND LIQUID CRYSTAL DISPLAY DEVICE INCLUDING THE SAME

(75) Inventor: Tae-Joon Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 598 days.

(21) Appl. No.: 12/434,909

(22) Filed: May 4, 2009

(65) Prior Publication Data

US 2009/0303426 A1    Dec. 10, 2009

(30) Foreign Application Priority Data

Jun. 9, 2008 (KR) .................. 10-2008-0053771

(51) Int. Cl.
*G02F 1/1345* (2006.01)
*H05K 1/11* (2006.01)

(52) U.S. Cl. ........................................ 349/150; 174/262
(58) Field of Classification Search .......... 349/149–152; 174/262–266
See application file for complete search history.

(56) References Cited

U.S. PATENT DOCUMENTS

| | | | | |
|---|---|---|---|---|
| 5,473,120 A | * | 12/1995 | Ito et al. ........................ | 174/264 |
| 2006/0016618 A1 | * | 1/2006 | Kim et al. ..................... | 174/255 |
| 2006/0044828 A1 | * | 3/2006 | Kim et al. ..................... | 362/613 |
| 2007/0124930 A1 | * | 6/2007 | Cheng et al. ................... | 29/852 |

FOREIGN PATENT DOCUMENTS

| | | |
|---|---|---|
| JP | 2002-236458 | 8/2002 |
| KR | 10-2006-0114880 | 11/2006 |
| KR | 10-2007-0079484 | 8/2007 |

\* cited by examiner

*Primary Examiner* — Mark Robinson
*Assistant Examiner* — Charles Chang
(74) *Attorney, Agent, or Firm* — Cantor Colburn LLP

(57) ABSTRACT

A flexible printed circuit board includes a base film made of an insulating material, a power application wiring disposed on a first surface of the base film, a bypass wiring disposed on a second surface, opposite the first surface, of the base film, a first connection wiring which electrically connects the power application wiring to the bypass wiring, a second connection wiring spaced apart from the first connection wiring and which electrically connects the power application wiring to the bypass wiring, and a first cover film disposed on the first surface of the base film to cover at least a first portion of the second connection wiring. At least a first portion of the first connection wiring is exposed through the first cover film.

22 Claims, 8 Drawing Sheets

FLEXIBLE PRINTED CIRCUIT BOARD AND LIQUID CRYSTAL DISPLAY DEVICE INCLUDING THE SAME

This application claims priority to Korean Patent Application No. 10-2008-0053771, filed on Jun. 9, 2008, and all the benefits accruing therefrom under 35 U.S.C. §119, the contents of which in its entirety are herein incorporated by reference.

BACKGROUND OF THE INVENTION

1. Field of the Invention

The present invention relates to a flexible printed circuit board and a liquid crystal display device including the same, and more particularly, to a flexible printed circuit board which allows lamps to remain lit even when open portions occur in wiring terminals which extend to the lamps, and a liquid crystal display device including the flexible printed circuit board.

2. Description of the Related Art

A liquid crystal display ("LCD") device is a commonly used type of flat panel display. In general, the LCD device, which includes two panels each having a plurality of electrodes disposed thereon and a liquid crystal layer interposed therebetween, controls a transmittance of light incident to the two panels by applying voltages to electrodes of the plurality of electrodes. As a result, orientations of liquid crystal molecules in the liquid crystal layer are arranged to display an image on the LCD.

The LCD device typically includes an LCD panel for displaying the image, as well as a backlight assembly for supplying the LCD panel with light, since the LCD device is a passive light-emitting device.

The backlight assembly emits light using a flexible printed circuit board having lamps, such as light emitting diodes ("LEDs"), for example, mounted thereon, and a lamp driving printed circuit board. Typically, the flexible printed circuit board having the lamps mounted thereon is electrically connected to the lamp driving printed circuit board using wiring disposed on one or, alternatively, both surfaces thereof.

However, portions of the wiring disposed on the flexible printed circuit board and, more specifically, portions to which external power is applied, are not covered with a cover film. As a result, cracks occur in the portions of the wirings not covered with the cover film, resulting in open-circuits in the wirings, causing interruptions in the external power supplied to the lamps, thereby preventing the lamps from turning on, substantially decreasing a display quality of the LCD device.

BRIEF SUMMARY OF THE INVENTION

Exemplary embodiments of the present invention provide a flexible printed circuit board which allows a lamp to be lit even when wiring terminals which extend to the lamp include open-circuited portions.

Exemplary embodiments of the present invention also provide a liquid crystal display device including the flexible printed circuit board.

According to an exemplary embodiment of the present invention, a flexible printed circuit board includes a base film made of an insulating material, a power application wiring disposed on a first surface of the base film, a bypass wiring disposed on a second surface, opposite the first surface, of the base film, a first connection wiring which electrically connects the electrical power application wiring to the bypass wiring, a second connection wiring spaced apart from the first connection wiring and which electrically connects the electrical power application wiring to the bypass wirings, and a first cover film disposed on the first surface of the base film to cover at least a first portion of the second connection wiring. At least a first portion of the first connection wiring is exposed through the first cover film.

According to an alternative exemplary embodiment of the present invention, a liquid crystal display device includes a light guide plate which guides light, and a flexible printed circuit board. The flexible printed circuit board includes a base film made of an insulating material, a power application wiring disposed on a first surface of the base film, a bypass wiring disposed on a second surface, opposite the first surface, of the base film, a first connection wiring which electrically connects the electrical power application wiring to the bypass wiring, a second connection wiring spaced apart from the first connection wiring and which electrically connects the electrical power application wiring with the bypass wiring, and a first cover film disposed on the first surface of the base film to cover at least a first portion of the second connection wiring. At least a first portion of the first connection wiring is exposed through the first cover film. The liquid crystal display device further includes a lamp disposed on the flexible printed circuit board and electrically connected to the power application wiring, and a lower receiving container which accommodates the light guide plate.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
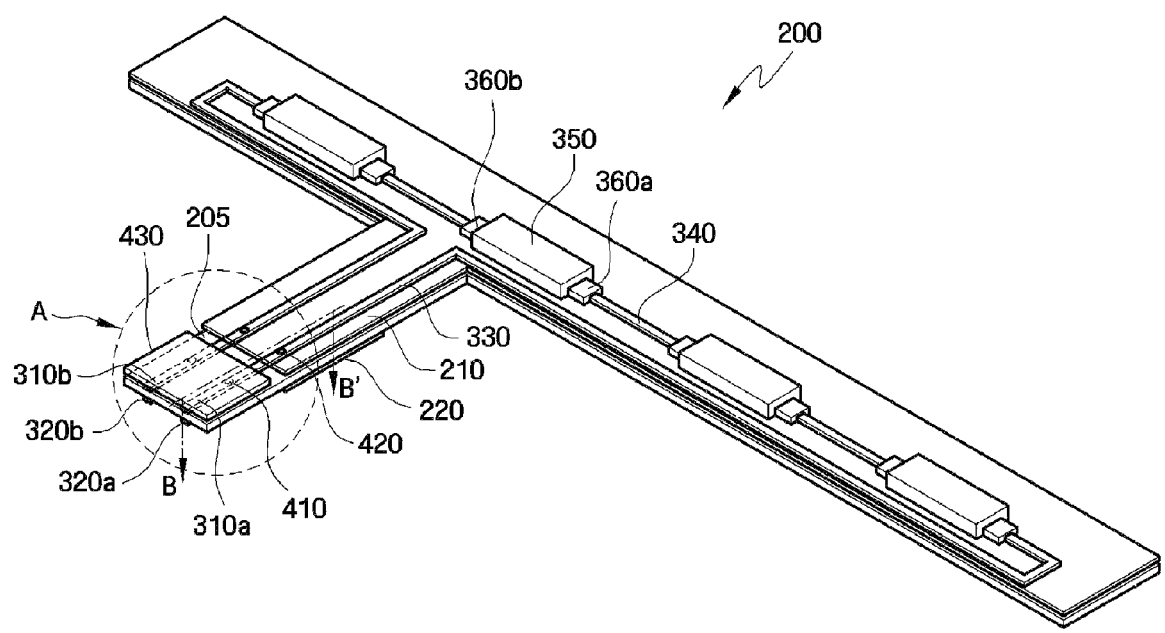
FIG. 1 is a perspective view of an exemplary embodiment of a flexible printed circuit board according to the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Figure 2:
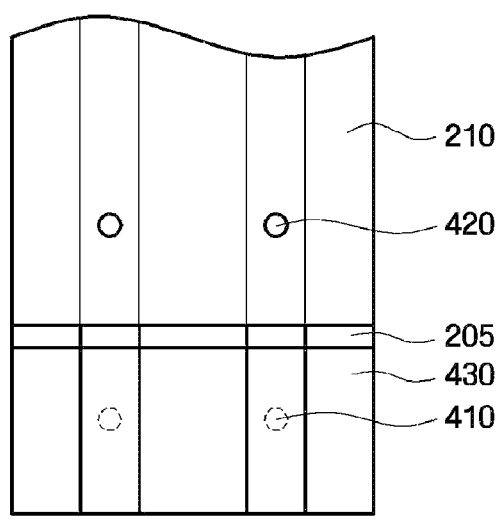
FIG. 2 is an enlarged portion "A" of FIG. 1.
Figure 3:
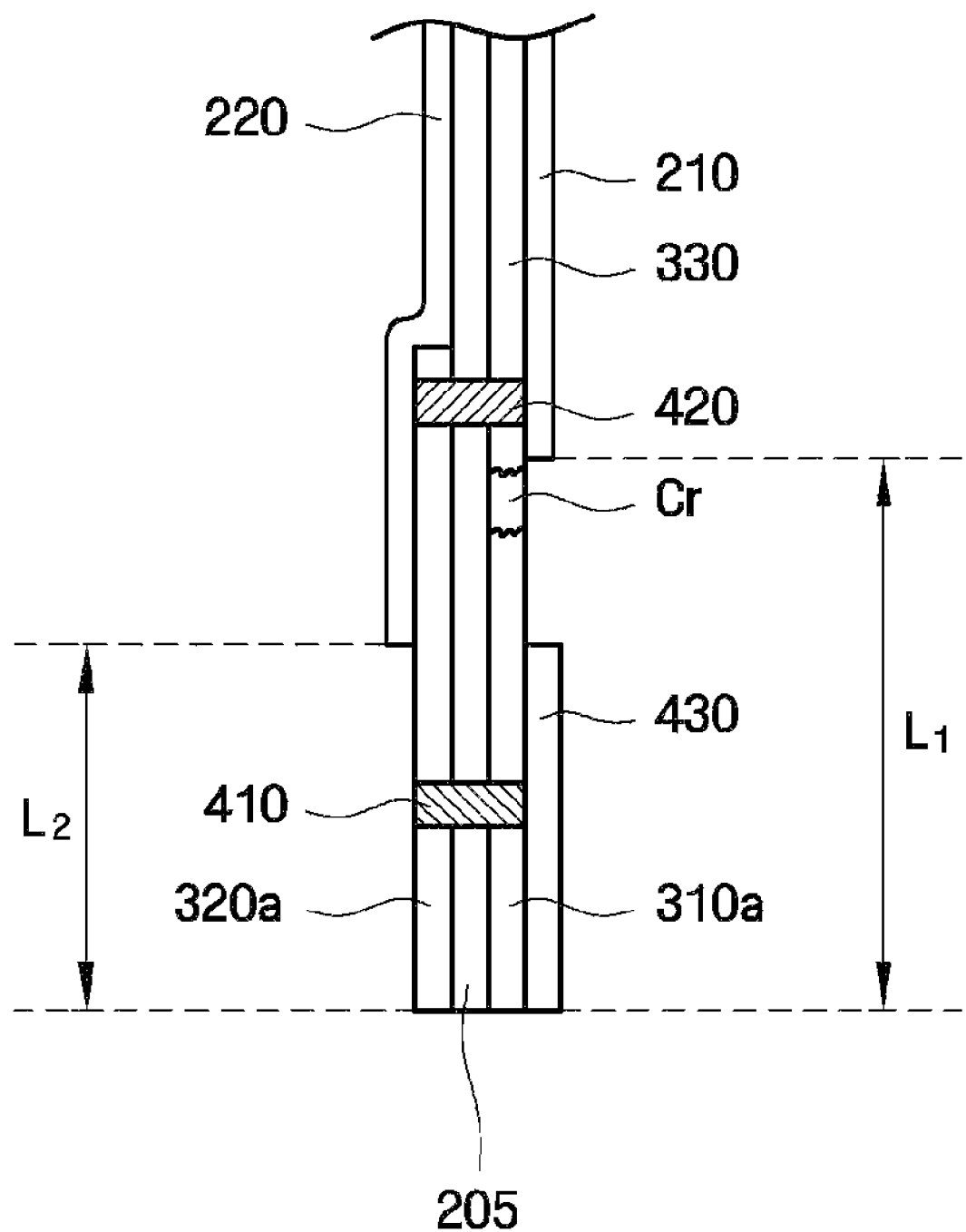
FIG. 3 is a partial cross-sectional view taken along line B-B' of FIG. 1.

Hereinafter, a flexible printed circuit board of a liquid crystal display ("LCD") device according to an exemplary embodiment of the present invention will be described in further detail with reference to FIGS. 1 through 3. FIG. 1 is a perspective view of an exemplary embodiment of a flexible printed circuit board according to the present invention, FIG. 2 is an enlarged portion "A" of FIG. 1, and FIG. 3 is a partial cross-sectional view taken along line B-B' of FIG. 1.

In an exemplary embodiment, a flexible printed circuit board 200 includes a base film 205, power application wirings 310a, 310b and 330 disposed on a first surface, e.g., on an upper surface, as viewed in FIG. 1, of the base film 205, bypass wirings 320a and 320b formed on a second surface, opposite the first surface, of the base film 205, a first connection wiring 410 and a second connection wiring 420 which connect the power application wirings 310a, 310b and 330 with the bypass wirings 320a and 320b.

In an exemplary embodiment, the base film 205 is flexible, e.g., is easily bendable. In addition, the base film 205 according to an exemplary embodiment may be made of a material having an excellent electric insulating property, such as polyimide, for example. The base film 205 may include a lamp mount portion on which a plurality of lamps 350 are mounted, and terminal portions extending from the lamp mount portion and having first ends at which the power application wirings 310a and 310b and the bypass wirings 320a and 320b are disposed. The terminal portions may be bent away from the lamp mount portion, and the base film 205 may have, for example, a "T" shape or an "L" shape. However, exemplary embodiments of the present invention are not limited to the foregoing examples, and the base film 205 according to an alternative exemplary embodiment may be formed in a bar shape, e.g., the terminal portion and the lamp mount portion are not.

Lamps 350 of the plurality of lamps 350 are mounted on the lamp mount portion of the base film 205, which may have a substantially bar shape. Specifically, the lamps 350 may be mounted on a first surface of the lamp mount portion of the base film 205. The lamps 350 according to an exemplary embodiment may be line light sources, such as light emitting diodes ("LEDs"), for example. A plurality of the LEDs may be arranged lengthwise on the lamp mount portion at predetermined intervals. The LEDs may include white LEDs which emit white light, or an LED package including red, green and blue LEDs mixed therein and emitting red, green, blue and/or white light, or combinations thereof.

Opposite ends of each LED are connected to the lamp connection terminals 360a and 360b. The lamp connection terminals 360a and 360b according to an exemplary embodiment may be made of a conductive material.

Leads disposed at the opposite ends of each LED are connected to the lamp connection terminals 360a and 360b. Specifically, the lamp connection terminals 360a and 360b may be connected to external terminals, e.g., positive and negative electrodes, respectively, of an external power source (not shown). The lamp connection terminals 360a and 360b, each having LEDs mounted thereon, are connected to each other by a lamp connection wiring pattern 340. The lamp connection terminals 360a and 360b positioned at an outermost peripheral part of the flexible printed circuit board 200 are connected to the electrical power application wiring 330. In an exemplary embodiment, LEDs may be connected in electrical series or, alternatively, in electrical parallel with each other.

The power application wirings 310a, 310b and 330 are bent toward the terminal portion of the flexible printed circuit board 200 to connect to the external power source (not shown).

In an exemplary embodiment, the power application wirings 310a, 310b and 330 and the lamp connection wiring pattern 340 may be made of a metal such as copper (Cu), aluminum (Al), silver (Ag), nickel (Ni) or alloys thereof, but alternative exemplary embodiments are not limited thereto.

The power application wirings 310a, 310b and 330 and the lamp connection wiring pattern 340 may be formed on the first surface of the base film 205 using a process such as casting, laminating or electroplating, for example. In the casting process, the base film 205, while still in a liquid form, is cast on a rolled copper foil, followed by a curing process. In the laminating process, a rolled copper foil is placed on the base film 205 and is then thermally compressed. In the electroplating process, a Cu seed layer is deposited on the base film 205, which is then immersed in an electrolyte having copper melted therein, followed by applying electricity thereto, thereby forming a copper foil. In this case, a wiring pattern is formed such that the copper foil is selectively etched using photo/etching to construct predetermined circuit components.

The power application wirings 310a and 310b are connected to the positive and negative electrode terminals of the external power source (not shown), respectively, to form a closed circuit including the lamps 350 and the lamp connection wiring pattern 340.

A first cover film 210 is formed on the first surface of the base film 205 to cover the power application wirings 310a, 310b and 330 and the lamp connection wiring pattern 340, thereby protecting the power application wirings 310a, 310b and 330 and the lamp connection wiring pattern 340 from damage from impact and corrosive materials, for example. A solder resist may be used as the first cover film 210. However the first cover film 210 is not formed at terminal portions of the power application wirings 310a, 310b and 330. As a result, the terminal portions of the power application wirings 310a, 310b and 330 are exposed.

The terminal portions of the power application wirings 310a and 310b formed at ends of the base film 205 are portions for receiving external power from the external power source (not shown). The terminal portions of the power application wirings 310a and 310b may be wider than other portions of the power application wirings 310a, 310b and 330 to substantially lower a contact resistance with the external terminals of the external power source.

As described above, the flexible printed circuit board 200 is bent and the terminal portions 310a and 310b are exposed outside, rather than being covered by the first cover film 210. As a result, open portions Cr, such as cracks Cr, occur at and/or in the terminal portions of the power application wirings 310a and 310b (for simplicity, hereinafter referred to as terminal portions 310a and 310b).

As described in greater detail above, when the open portions Cr occur at the terminal portions 310a and 310b, lamps 350 associated with open portions Cr are not lit (e.g., are not lit ON) when the external power is applied to the display device. Thus, the flexible printed circuit board 200 according to an exemplary embodiment includes bypass wirings 320a and 320b, a first connection wiring 410 and a second connection wiring 420, thereby allowing power to be applied to the lamps 350 even when the open portions Cr occur at the terminal portions 310a and 310b.

In an exemplary embodiment, the bypass wirings 320a and 320b are formed on the second surface of the base film 205, as shown in FIGS. 1 and 3. The bypass wirings 320a and 320b may be formed in substantially the same manner and of substantially the same material as the power application wirings 310a and 310b, but alternative exemplary embodiments are not limited thereto. The bypass wirings 320a and 320b are connected to the power application wirings 310a and 310b by the first connection wiring 410 and second connection wiring 420, respectively.

According to an exemplary embodiment, at least one of the first connection wiring 410 and the second connection wiring 420 may be a via, e.g., an aperture, formed to penetrate, e.g., formed through, the base film 205, thereby connecting the power application wirings 310a and 310b to the bypass wirings 320a and 320b, respectively. In an exemplary embodiment, for example, the first connection wiring 410 and the second connection wiring 420 may be a first via 410 and a second via 420, respectively.

The first via 410 and the second via 420 may be formed by perforating the base film 205 at a predetermined distance to form via holes, e.g., via apertures, and then filling the via holes with a conductive material, such as Cu or Al, for example. In an exemplary embodiment, casting, laminating or electroplating, for example, may be employed to form and/or fill the via holes. Further, the first via 410 and the second via 410 may be formed at a same time as when the power application wirings 310a and 310b and/or the bypass wirings 320a and 320b are formed. Additionally, the first via 410 may be formed at ends of the power application wirings 310a and 310b. As a result, the first via 410 is exposed, e.g., is not covered by the first cover film 210, to be connected to the external power source (not shown), as shown in FIG. 3.

A solder portion 430 is formed on the power application wirings 310a and 310b and/or the bypass wirings 320a and 320b to connect the power application wirings 310a and 310b and/or the bypass wirings 320a and 320b to the external terminals (not shown). Alternatively, the solder portion 430 may be also formed to cover the first via 410, as shown in FIG. 3. Thus, the power application wirings 310a and 310b and/or the bypass wirings 320a and 320b are electrically connected to the external terminals by soldering, but alternative exemplary embodiments are not limited thereto.

In an exemplary embodiment of the present invention, the second connection wiring 420, e.g., the second via 420, may be formed at a portion 330 of the electrical power application wiring portion 330 which is covered by the first cover film 210, as shown in FIG. 3. The electrical power application wiring portion 330 covered by the first cover film 210 is less prone to open portions Cr than the terminal portions 310a and 310b of the power application wirings 310a, 310b and 330. Thus, open portions Cr are more likely to occur at the terminal portions 310a and 310b of the flexible printed circuit board 200, e.g., portions which are not covered by the first cover film 210. Specifically, the open portions Cr typically occur between the second connection wiring 420 and the first connection wiring 410, as shown in FIG. 3. However, in the flexible printed circuit board 200 according to an exemplary embodiment of the present invention, the external power supplied through the solder portion 430 penetrates through the bypass wirings 320a and 320b and the second connection wiring 420, and is then transferred to the electrical power application wiring 330 even when the open portions Cr occur at the terminal portions 310a and 310b among the power application wirings 310a, 310b and 330. Therefore, the lamps 350 receive the external power, e.g., the lamps 350 are lit ON despite the open portions Cr. Specifically, in an exemplary embodiment, when the external power is applied to the terminal portions 310a and 310b of the power application wirings 310a, 310b and 330, the external power may sequentially pass through the terminal portions 310a and 310b of the power application wirings 310a, 310b and 330, the first connection wiring 410, the bypass wirings 320a and 320b and the second connection wiring 420 to be transferred to the electrical power application wiring 330, thereby allowing the lamps 350 to be lit ON.

In an exemplary embodiment, the bypass wirings 320a and 320b may be partially covered by a second cover film 220, as shown in FIGS. 1 and 3. The second cover film 220 is formed on the second surface of the base film 205 and the bypass wirings 320a and 320b. Thus, the second cover film 220 substantially covers the second connection wiring 420 while leaving the first connection wiring 410 exposed, as shown in FIG. 3.

In an exemplary embodiment, the first cover film 210 and the second cover film 220 may be disposed to have different lengths from an edge of the flexible printed circuit board 200. Specifically and referring to FIG. 3, the first cover film 210 may be disposed at a first length $L_1$ from the edge of the flexible printed circuit board 200, and the second cover film 220 may be disposed at second length $L_2$ from the edge of flexible printed circuit board 200. Thus, the first length $L_1$ and the second length $L_2$ correspond to portions of the base film 205 exposed by the first cover film 210 and the second cover film 220, respectively. The first length $L_1$ and the second length $L_2$ are different because open portions Cr may occur at the bypass wirings 320a and 320b as well as to the terminal portions 310a and 310b of the power application wirings 310a, 310b and 330 when the flexible printed circuit board 200 is bent, for example. Thus, an occurrence of the open portions Cr is effectively minimized by the lengths of the first cover film 210 and the second cover film 220. It will be noted that, while the second cover film 220 of the exemplary embodiment shown in FIG. 3 is longer than the first cover film 210, alternative exemplary embodiments of present the invention are not limited thereto. For example, in an alternative exemplary embodiment, the first cover film 210 may be longer than the second cover film 220.

Figure 4:
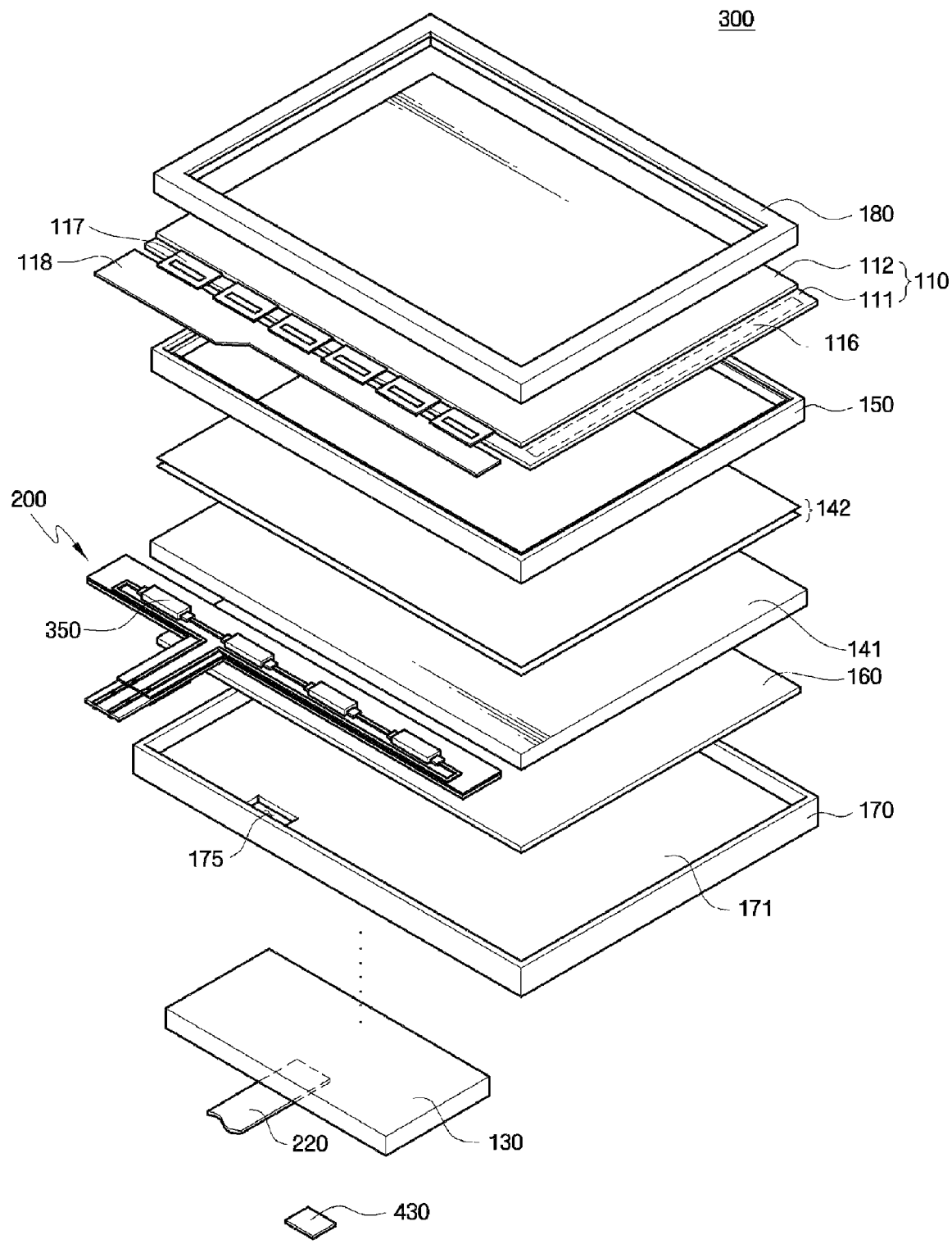
FIG. 4 is an exploded perspective view of an exemplary embodiment of a liquid crystal display ("LCD") device including a flexible printed circuit board according to the present invention.
Figure 5:
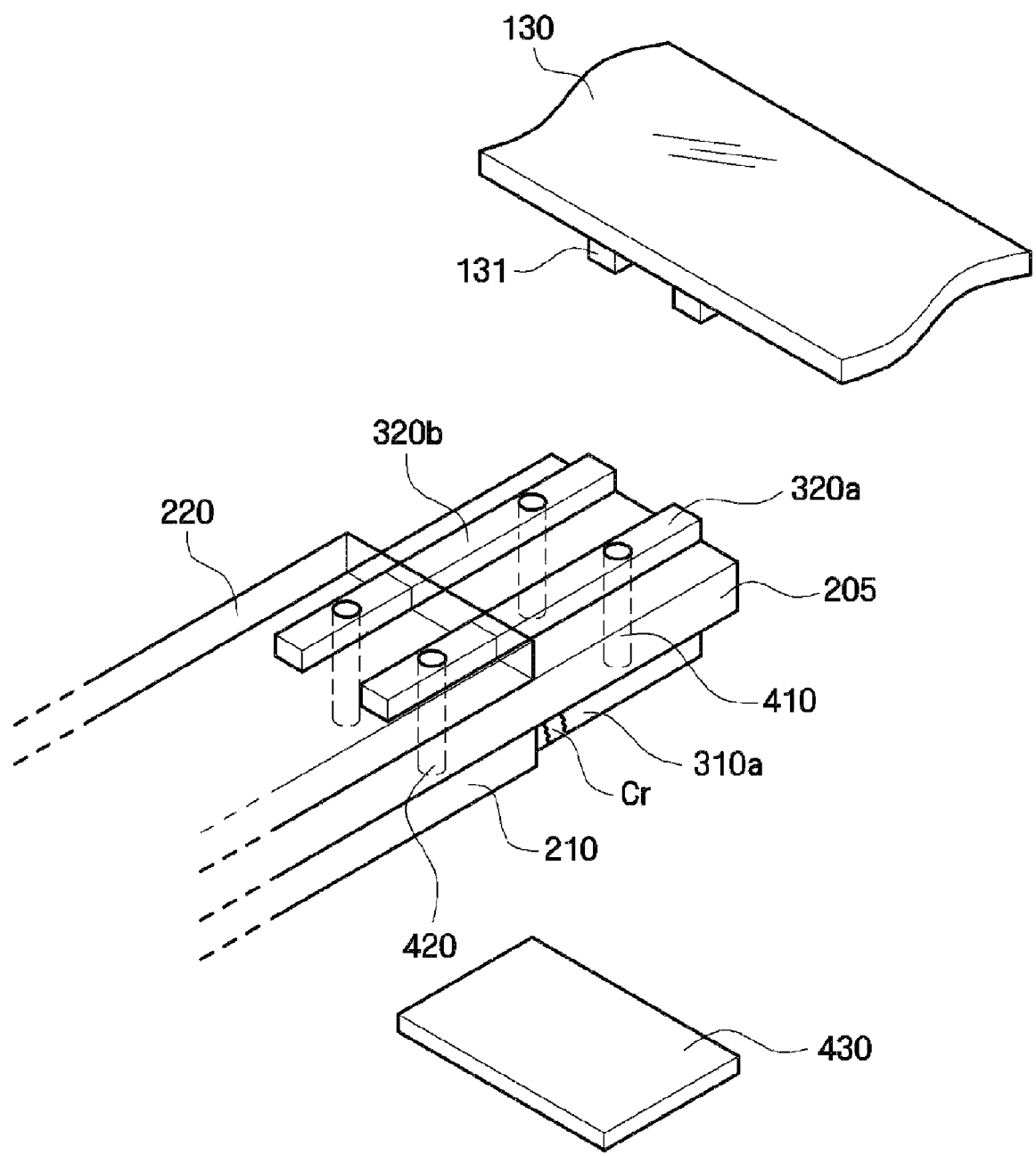
FIG. 5 is an exploded perspective view illustrating an exemplary embodiment of a connection between the flexible printed circuit board and a lamp driving printed circuit board included in the LCD device according to the exemplary embodiment of the present invention shown in FIG. 4.

Hereinafter, an LCD device according to an exemplary embodiment of the present invention will be described in further detail with reference to FIGS. 4 and 5. FIG. 4 is an exploded perspective view of an exemplary embodiment of an LCD device including a flexible printed circuit board according to the present invention, and FIG. 5 is an exploded perspective view illustrating an exemplary embodiment of a connection between the flexible printed circuit board and a lamp driving printed circuit board included in the LCD device according to the exemplary embodiment of the present invention shown in FIG. 4. The same or like components in FIGS. 4 and 5 as in FIGS. 1-3 have the same the reference characters, and any repetitive detailed description thereof will hereinafter be omitted.

Referring to FIGS. 4 and 5, an LCD device 300 according to an exemplary embodiment of the present invention includes an LCD panel assembly and a backlight assembly.

The LCD panel assembly includes an LCD panel 110 including a first substrate 111, a second substrate 112, polarizing films (not shown) disposed thereon, liquid crystal (not shown), a gate driving integrated circuit ("IC") 116, a data tape carrier package ("TCP") 117, an LCD panel driving printed circuit board ("PCB") 118.

The LCD panel 110 includes a first substrate 111 including gate lines (not shown), data lines (not shown) and pixel electrodes (not shown) disposed thereon. The LCD panel 110 further includes a second substrate 112 having a black matrix (not shown), a color filter (not shown), and a common electrode (not shown). The second substrate 112 is disposed opposite to, e.g., facing, the first substrate 111. In an exemplary embodiment, a polarizing film is disposed below the first substrate 111, and a polarizing film disposed above the second substrate 112. The color filter and/or the common electrode may be disposed on the first substrate 111, but alternative exemplary embodiments are not limited thereto.

In an exemplary embodiment, the LCD panel 110 includes a stack of the above-described components. The LCD panel 110 is disposed in an intermediate receiving container 150, described in further detail below.

The gate driving IC 116 is integrated on, e.g., is disposed on, the first substrate 111 and is connected to each of the gate lines (not shown). Further, the data tape carrier package 117 is connected to each of the data lines (not shown) disposed on the first substrate 111.

Driving components for processing a gate driving signal applied to the gate driving IC 116 and a data driving signal applied to the data tape carrier package 117 may be mounted on the LCD panel driving printed circuit board 118.

The backlight assembly according to an exemplary embodiment includes a light guide plate 141, one or more optical sheets 142, a reflection sheet 160, the flexible printed circuit board 200, the lamps 350, the intermediate receiving container 150, and a lower receiving container 170.

The light guide plate 141 is disposed in a lower receiving container 170 and guides light emitted from the lamps 350 toward the LCD panel 110.

In an exemplary embodiment, the light guide plate 141 may include a transparent material to efficiently guide the light, including acryl resin such as polymethyl methacrylate ("PMMA"), a material having a predetermined a refractive index and/or polycarbonate ("PC"), for example, but alternative exemplary embodiment of the present invention are not limited thereto.

The light guide plate 141 is made of a material having an angle within a critical angle range of the light guide plate 141. Thus, the light, incident into a first, e.g., lower, side of the light guide plate 141 is transferred into the light guide plate 141. When the light is incident into a top surface or bottom surface within the light guide plate 141, an angle of the incident light exceeds the critical angle range, and the light is not emitted outside the light guide plate 141, but is instead transmitted evenly inside the light guide plate 141.

In addition, a dispersion pattern (not shown) may be formed on at least one of the top surface and the bottom surface of the light guide plate 141, for example, to allow the guided light to be emitted upward, e.g., toward the LCD panel 110.

The one or more optical sheets 142 are disposed above the light guide plate 141 to diffuse and/or focus the light transferred from the light guide plate 141 toward the LCD panel 110. The one or more optical sheets 142 according to an exemplary embodiment may include a diffusing sheet, a prism sheet and a protective sheet, for example, but alternative exemplary embodiments are not limited thereto. In an exemplary embodiment, the diffusing sheet may be disposed between the light guide plate 141 and the prism sheet. The diffusing sheet may diffuse the light incident from the light guide plate 141 to effectively prevent the diffused light from being partly aggregated, e.g., concentrated. The prism sheet may include triangular prisms disposed in a predetermined arrangement thereon. The prism sheet may focus the light diffused from the diffusing sheet in a direction substantially perpendicular to the LCD panel 110. The protective sheet may be formed over the prism sheet, and may protect a surface of the prism sheet and/or disperse the light to make the light uniformly distributed.

The intermediate receiving container 150 may have a substantially rectangular shape, including four side walls and a support base. The four side walls of the intermediate receiving container 150 may be connected to side walls of the lower receiving container 170, and the support base of the intermediate receiving container 150 support the LCD panel 110 and compressively fixes the light guide plate 141 and the optical sheets 142 therein.

To prevent components fixed by the intermediate receiving container 150, the intermediate receiving container 150 may be formed as a mold frame made of a plastic material, for example, but alternative exemplary embodiments are not limited thereto.

In an exemplary embodiment, the reflection sheet 160 may be made of a material having a reflective property, such as polyethylene terephthalate ("PET"), for example. A surface of the reflection sheet 160 may be coated with a diffusive layer containing titanium dioxide, for example, but alternative exemplary embodiments of the present invention are not limited thereto.

The reflection sheet 160 is disposed at a bottom surface of the light guide plate 141, thereby reflecting the light emitted from the below the light guide plate 141 upward, e.g., toward the LCD panel 110, and the sidewalls of the lower receiving container 170. More specifically, light which is not reflected by microdot patterns formed on the rear surface of the light guide plate 141 is further reflected to the exit surface of the light guide plate 141, thereby effectively reducing loss of light.

The lower receiving container 170 includes a bottom plate 171 on which the light guide plate 141 and the lamps 350 are disposed, and lower receiving container side walls which extend from respective peripheral edges of the bottom plate 171 in directions substantially perpendicular to a plane defined by the bottom plate 171, as shown in FIG. 4. Upper portions of the lower receiving container side walls may be bent to accommodate components and/or to cover the lamps 350.

A throughhole 175, e.g., an aperture 175, may be formed in the bottom plate 171 of the lower receiving container 170 to allow a terminal portion of the flexible printed circuit board 200 to pass therethrough.

The flexible printed circuit board 200 according to the exemplary embodiment of the present invention is substantially the same as the flexible printed circuit board 200 described in greater detail above with reference to FIGS. 1-3. In an exemplary embodiment, a portion of the flexible printed circuit board 200 penetrates through the throughhole 175, e.g., the aperture 175, and is thereby disposed on a lower, e.g., bottom, surface of the lower receiving container 170. Thus, a lamp mount portion of the flexible printed circuit board 200 is disposed at a side of the light guide plate 141, while a terminal portion of the flexible printed circuit board 200 is bent toward the bottom surface of the lower receiving container 170. Therefore, power from the lamp driving printed circuit board 130 is applied to the flexible printed circuit board 200. In an alternative exemplary embodiment, the flexible printed circuit board 200 is not mounted directly on the bottom surface of the lower receiving container 170 through the aperture 175, however. In an alternative exemplary embodiment of the present invention, for example, the flexible printed circuit board 200 may be bent along the side walls of the lower receiving container 170 to be mounted on the bottom surface of the lower receiving container 170. Alternatively, the flexible printed circuit board 200 may be mounted on the bottom plate 171 of the lower receiving container 170, but alternative exemplary embodiments of the present invention are not limited thereto.

The flexible printed circuit board 200 according to an exemplary embodiment of the present invention may further include the solder portion 430 formed on the power application wirings 310*a*, 310*b* and 330 and/or the bypass wirings 320*a* and 320*b* to connect the same to the first connection wiring 410. The flexible printed circuit board 200 is thereby connected to the lamp driving printed circuit board 130 by the solder portion 430. In an alternative exemplary embodiment, power applied from an external electrode 131 (FIG. 5) of the lamp driving printed circuit board 130 is connected to the lamps 350 through an additional solder portion (not shown) connected to the bypass wirings 320*a* and 320*b*, the bypass wirings 320*a* and 320*b*, the second connection wiring 420, and the electrical power application wiring 330. Accordingly, even when open portions Cr occur in the power application wirings 310*a*, 310*b* and 330 of the flexible printed circuit board 200, the external power is transferred to the lamps 350 around the open portions Cr, thereby preventing non-lighting of the lamps 350, e.g., the lamps 350 still receive the external power, even when the open portions Cr occur in the power application wirings 310*a*, 310*b* and 330 of the flexible printed circuit board 200 according to an exemplary embodiment of the present invention. It will be noted that alternative exemplary embodiments are not limited to the foregoing description. Rather, the external power to the lamps 350 may pass through the terminal portions 310*a* and 310*b* of the power application wirings 310*a*, 310*b* and 330, the first connection wiring 410, the bypass wirings 320*a* and 320*b*, and the second connection wiring 420, to be transferred to the electrical power application wiring 330, thereby allowing the lamps 350 to be lit ON, as described in greater detail above with reference to FIGS. 1-3. Thus, according to an exemplary embodiment, at least one of the first connection wiring 410 and the second connection wiring 420 may be a via, e.g., the first via 410 and the second via 420, thereby connecting the power application wirings 310*a*, 310*b* and 330 to the bypass wirings 320*a* and 320*b* through the base film 205. In an exemplary embodiment, the first connection wiring 410 and the second connection wiring 420 may be the first via 410 and the second via 420, respectively.

Referring again to FIG. 4, the upper receiving container 180 may be fastened to the lower receiving container 170 by a hook connection (not shown) and/or a screw connection (not shown). In addition, the upper receiving container 180 may be fastened to the lower receiving container 170 in various other manners.

Figure 6:
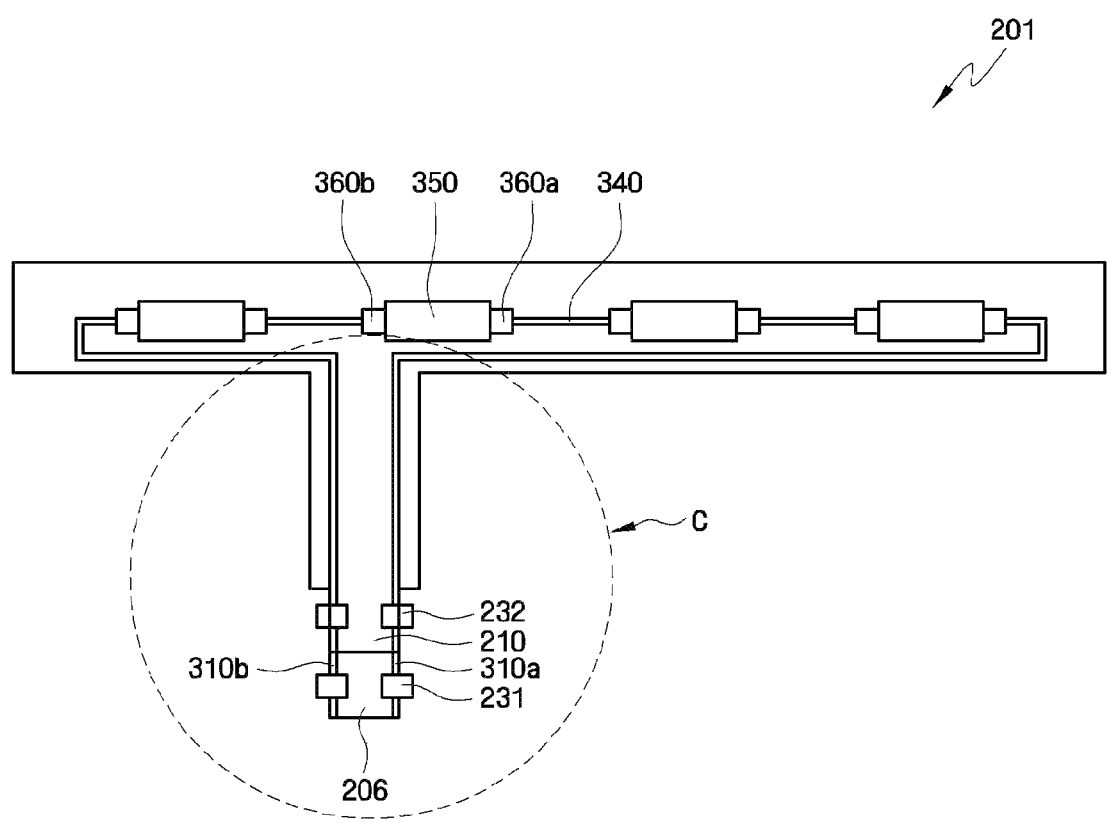
FIG. 6 is a front perspective view of an exemplary embodiment of a flexible printed circuit board according to the present invention.

Hereinafter, a flexible printed circuit board according to an alternative exemplary embodiment of the present invention will be described in further detail with reference to FIGS. 6 through 8. FIG. 6 is a front perspective view of an exemplary embodiment of an LCD including a flexible printed circuit board according to the present invention, FIG. 7 is an enlarged view of portion "C" of FIG. 6, and FIG. 8 is a partial cross-sectional view taken along line D-D' of FIG. 7.

Figure 7:
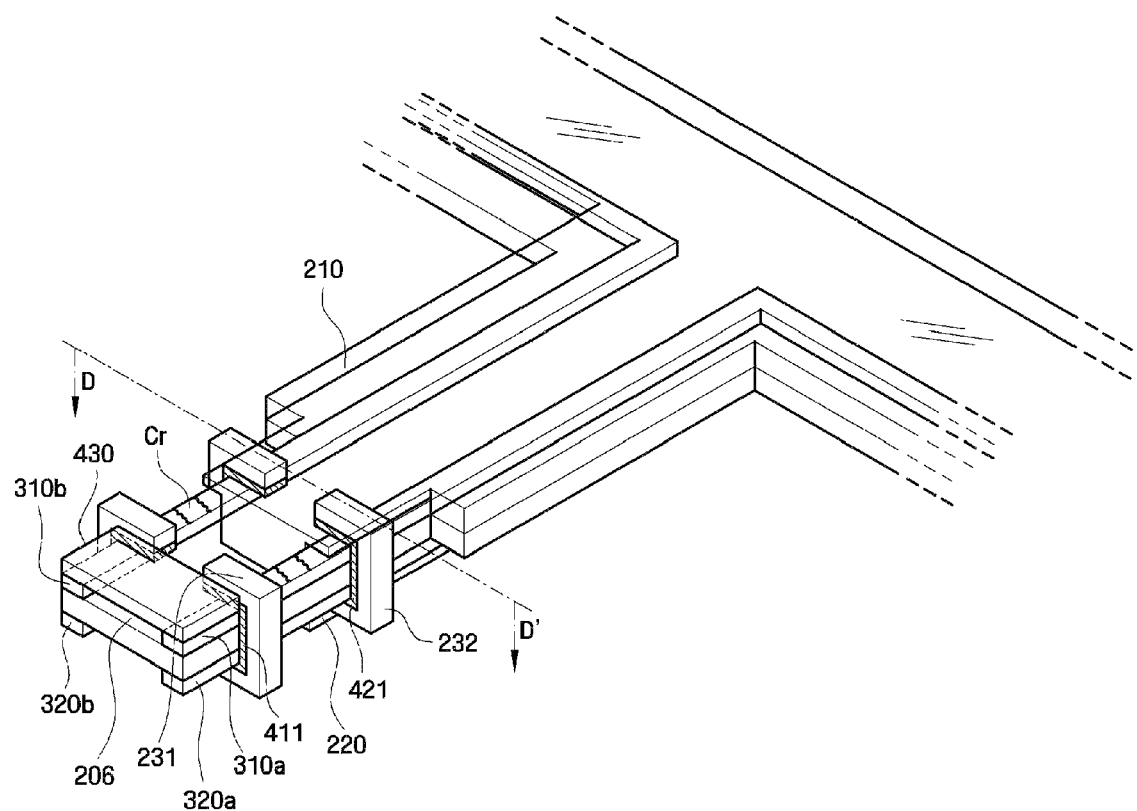
FIG. 7 is an enlarged view of portion "C" of FIG. 6.
Figure 8:
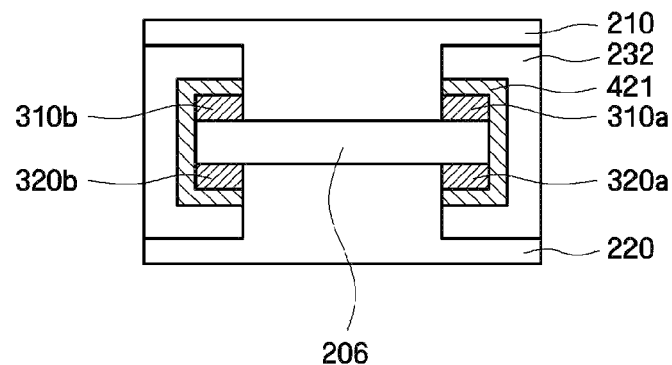
FIG. 8 is a partial cross-sectional view taken along line D-D' of FIG. 7.

In FIGS. 6-8, the same or like components as described above in greater detail with reference to FIGS. 1-5 are denoted by the same reference characters, and any repetitive detailed description thereof will hereinafter be omitted.

Referring to FIGS. 6 through 8, in a flexible printed circuit board 201 according to an alternative exemplary embodiment of the present invention, at least one of the first connection wiring 410 and the second connection wiring 420 may comprise a clip 232 disposed to wrap around outer peripheral surfaces of a base film 206 to connect the power application wirings 310a, 310b and 330 to the bypass wirings 320a and 320b.

Further, a width of an area on the base film 206 wherein the clip 232 is disposed may be reduced to facilitate disposing the clip 232 thereon.

Similar to as described above with reference to the first via 410 and/or the second via 420, the clip 232 according to an exemplary embodiment allows the external power to be applied to the lamps 350 even when open portions Cr, such as cracks Cr, occur in the power application wirings 310a, 310b, and 330. Thus, in an exemplary embodiment, when a first connection wiring 411 and a second connection wiring 421 are first and second clips 232, respectively, even when the crack Cr occurs in the electrical power application wiring 330 therebetween, the external power is transferred to the lamps 350 through the bypass wirings 320a and 320b, the first and/or second clip 232, and the electrical power application wiring 330.

The clip 232 according to an exemplary embodiment may be made of a same or like material as the power application wirings 310a, 310b and 330, and the bypass wirings 320a and 320b, e.g., a conductive material, but alternative exemplary embodiments of the present invention are not limited thereto.

As shown in FIG. 7, the clip 232 is bent away from the outer peripheral surface of the base film 206 in a substantially "U" shape, for example, and the clip 232 thereby makes electrical contact with the power application wirings 310a, 310b and 330, as well as the bypass wirings 320a and 320b.

In an exemplary embodiment, to prevent the first and/or the second clip 232, made of an electrically conducting material, from being subjected to a breakdown, e.g., a short circuit, due to impact for example, the first and/or the second clip 232 may be covered by a third cover film 231 made of an insulating material. The third cover film 231 is disposed to substantially cover the peripheral surface of the base film 206, portions of the power application wirings 310a, 310b and 330, and portions of the bypass wirings 320a and 320b, thereby substantially covering the first and/or the second clip 232. In an alternative exemplary embodiment of the present invention in which the external power source (not shown) does not contact the bypass wirings 320a and 320b but instead contacts the first clip 232, however, the third cover film 231 is not be formed at a contact portion between the first clip 232 and an external power terminal of the external power source.

As described above in greater detail, the first cover film 210 and the second cover film 220 may be disposed on the power application wirings 310a, 310b and 330, as well as on the flexible printed circuit board 201 to cover the second clip 232 while exposing the first clip 232. In addition the first cover film 210 and the second cover film 220 are formed to have different lengths, thereby reducing a risk of occurrence of cracks Cr therein.

Figure 9:
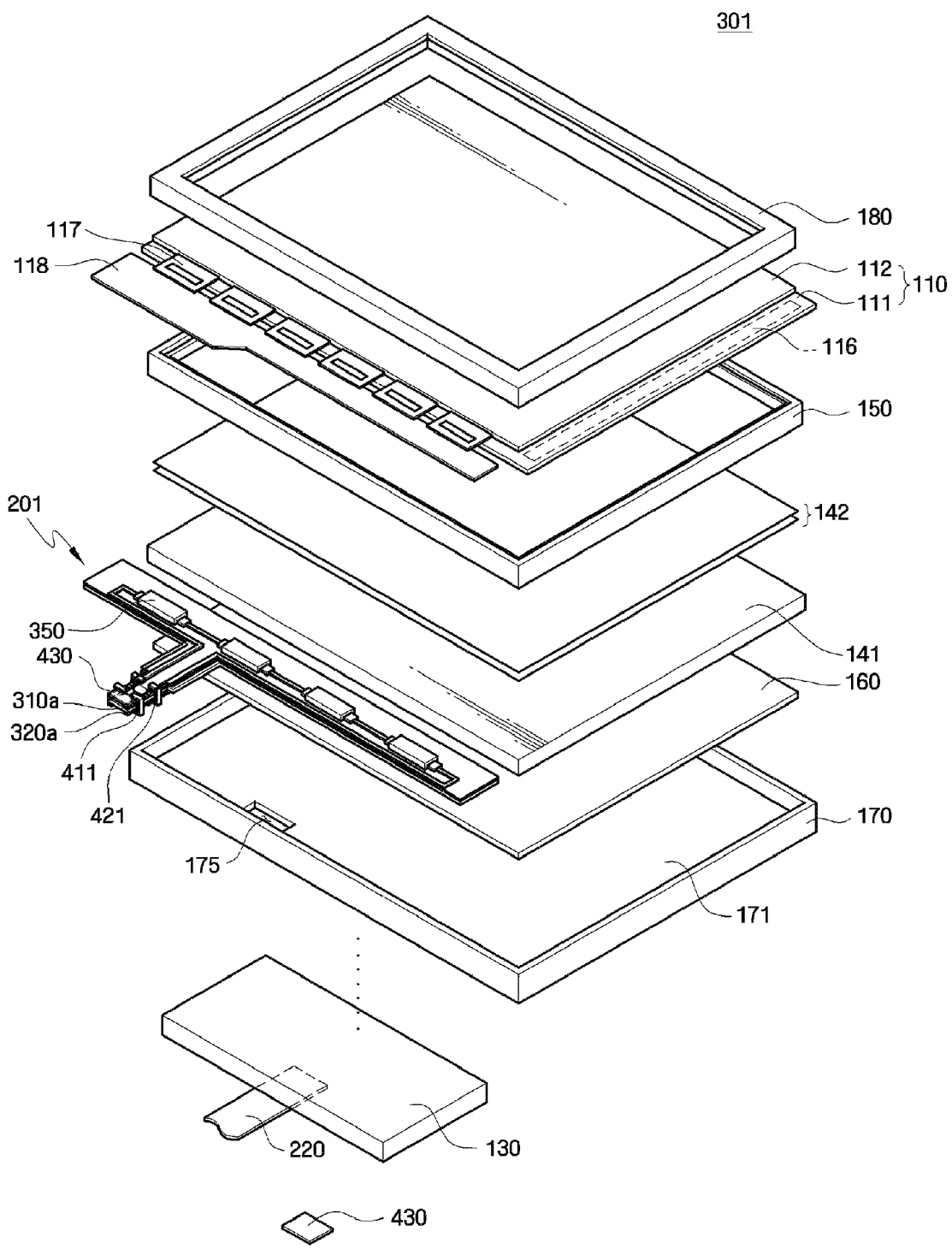
FIG. 9 is an exploded perspective view of an exemplary embodiment of an LCD device including a flexible printed circuit board according to the present invention.

Hereinafter, an LCD device according to an alternative exemplary embodiment of the present invention will be described in further detail with reference to FIGS. 9 and 10. FIG. 9 is an exploded perspective view of an exemplary embodiment of an LCD device including a flexible printed circuit board according to an exemplary embodiment of the present invention, and FIG. 10 is an exploded perspective view illustrating an exemplary embodiment of a connection between the flexible printed circuit board and a lamp driving printed circuit board included in the LCD device according to the exemplary embodiment of the present invention shown in FIG. 9.

Figure 10:
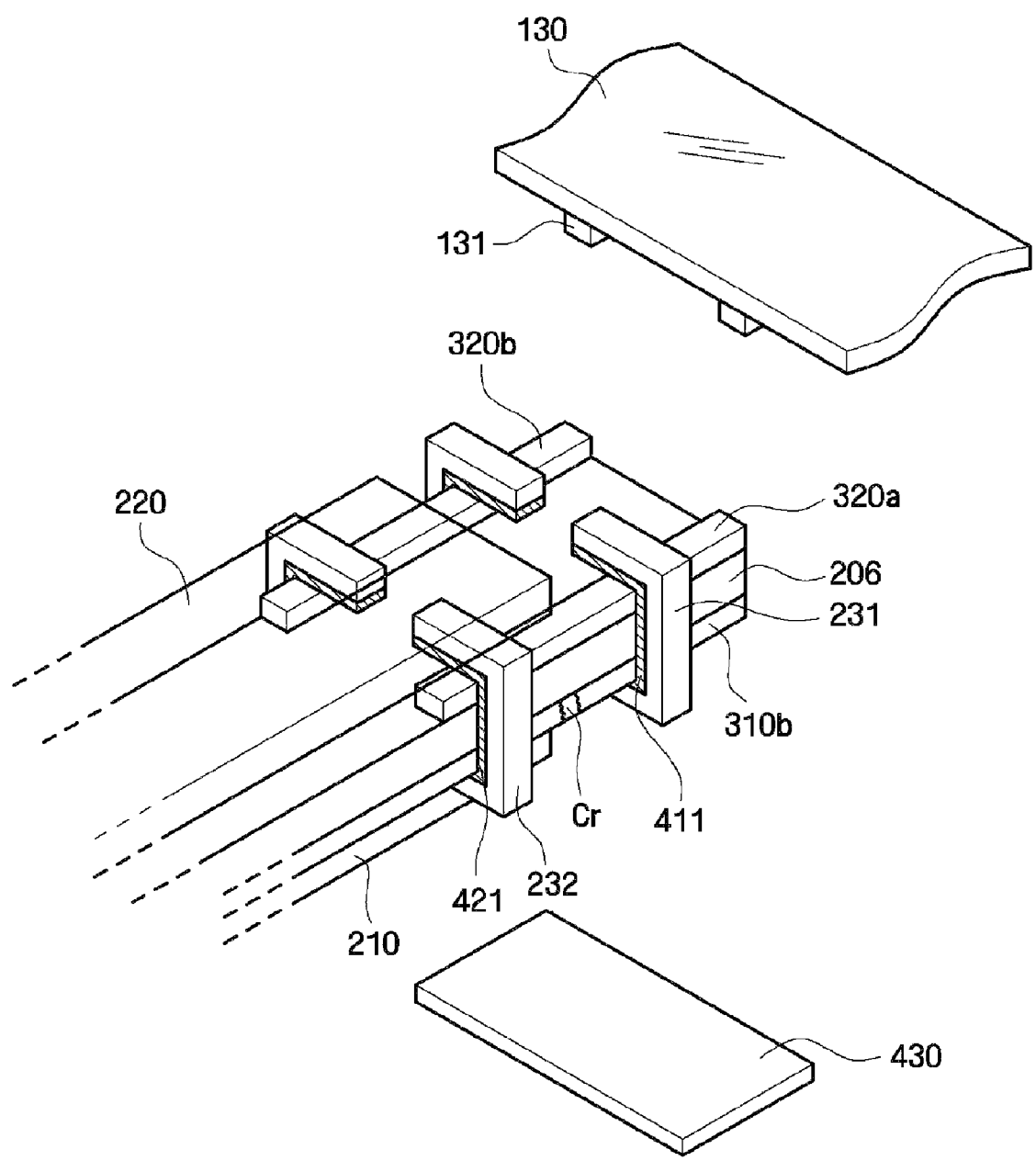
FIG. 10 is exploded perspective view illustrating an exemplary embodiment of a connection between the flexible printed circuit board and a lamp driving printed circuit board included in the LCD device according to the exemplary embodiment of the present invention shown in FIG. 9.

In FIGS. 9 and 10, the same or like components as described above in greater detail with reference to FIGS. 1-8 are denoted by the same reference characters, and any repetitive detailed description thereof will hereinafter be omitted.

An LCD device 301 according to an exemplary embodiment of the present invention includes a flexible printed circuit board 201 in which a first connection wiring 411 and/or a second connection wiring 421 include a first clip 411 and/or a second clip 421.

In addition, a bottom plate 171 of a lower receiving container 170 may include a throughhole 175, e.g., an aperture 175, through which a portion of the flexible printed circuit board 201 penetrates.

The flexible printed circuit board 201 according to an exemplary embodiment of the present invention may be substantially the same as flexible printed circuit board 201 described in greater detail above with reference to FIGS. 6-8, and the portion of the flexible printed circuit board 201 which penetrates through the throughhole 175, e.g., the aperture 175, is disposed on a rear surface of the lower receiving container 170.

The flexible printed circuit board 201 further includes a solder portion 430 disposed on the power application wirings 310a, 310b and 330 and/or the bypass wirings 320a and 320b. In an exemplary embodiment, the solder portion 430 may be disposed on the first clip 411 or connected to the first clip 411. Thus, the flexible printed circuit board 201 is connected to the lamp driving printed circuit board 130 through the solder portion 430, even when cracks Cr occur in the power application wirings 310a, 310b and 330 between the first clip 411 and the second clip 421, and the external power is thereby still transferred to the lamps 350.

According to exemplary embodiments of the present invention as described herein, a flexible printed circuit board allows a lamp of an LCD device to remain lit even when wiring terminals which extend to the lamp include open portions.

The present invention should not be construed as being limited to the exemplary embodiments set forth herein. Rather, these exemplary embodiments are provided so that this disclosure will be thorough and complete and will fully convey the concept of the present invention to those skilled in the art.

While the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:
1. A flexible printed circuit board comprising:
a base film made of an insulating material;
a power application wiring disposed on a first surface of the base film;
a bypass wiring disposed on a second surface, opposite the first surface, of the base film;

a first connection wiring which electrically connects the power application wiring to the bypass wiring;

a second connection wiring spaced apart from the first connection wiring and which electrically connects the power application wiring to the bypass wiring and; and a first cover film disposed on the first surface of the base film and the power application wiring to cover at least a first portion of the second connection wiring, wherein at least a first portion of the first connection wiring is exposed through the first cover film.

2. The flexible printed circuit board of claim 1, wherein at least one of the first connection wiring and the second connection wiring comprises a via disposed in the base film to connect the power application wiring to the bypass wiring.

3. The flexible printed circuit board of claim 1, further comprising a second cover film disposed on the second surface of the base film and the bypass wiring to cover at least a second portion of the second connection wiring, wherein at least a second portion of the first connection wiring is exposed through the second connection film.

4. The flexible printed circuit board of claim 3, wherein a length of the first cover film is different from that of the second cover film.

5. The flexible printed circuit board of claim 1, further comprising a solder portion disposed on one of the power application wiring and the bypass wiring to connect the one of the power application wiring and the bypass wiring to the first connection wiring.

6. The flexible printed circuit board of claim 1, wherein when an open circuit occurs at a portion of the power application wiring between the first connection wiring and the second connection wiring, an external power is supplied through the bypass wiring.

7. The flexible printed circuit board of claim 6, wherein the external power sequentially passes through the bypass wiring, the second connection wiring and the power application wiring.

8. The flexible printed circuit board of claim 1, wherein at least one of the first connection wiring and the second connection wiring comprises a clip disposed at an outer peripheral edge of the base film to connect the power application wiring to the bypass wiring.

9. The flexible printed circuit board of claim 8, further comprising a second cover film disposed on the second surface of the base film and the bypass wiring to cover at least a second portion of the second connection wiring, wherein at least a second portion of the first connection wiring is exposed through second cover film.

10. The flexible printed circuit board of claim 1, further comprising:

a second cover film disposed on the second surface of the base film and the bypass wiring to cover at least a second portion of the second connection wiring, wherein at least a second portion of the first connection wiring is exposed through second cover film, the first connection wiring comprises a first clip disposed at an outer peripheral edge of the base film to connect the power application wiring to the bypass wiring, and the second connection wiring comprises a second clip; and a third cover film disposed on at least one of the first surface of the base film and the second surface of the base film to cover at least a portion of the second clip.

11. The flexible printed circuit board of claim 1, wherein the first connection wiring and the second connection wiring are each disposed in separate independent spaced apart respective vias in the base film to connect the power application wiring to the bypass wiring.

12. A liquid crystal display device comprising:

a light guide plate which guides light;

a flexible printed circuit board comprising:

a base film made of an insulating material;

a power application wiring disposed on a first surface of the base film;

a bypass wiring disposed on a second surface, opposite the first surface, of the base film;

a first connection wiring which electrically connects the power application wiring to the bypass wiring;

a second connection wiring spaced apart from the first connection wiring and which electrically connects the power application wiring to the bypass wiring and; and a first cover film formed on the first surface of the base film to cover at least a first portion of the second connection wiring, wherein at least a first portion of the first connection wiring is exposed through the first cover film;

a lamp disposed on the flexible printed circuit board and electrically connected to the power application wiring; and a lower receiving container which receives the light guide plate.

13. The liquid crystal display device of claim 12, further comprising a solder portion disposed on the power application wiring and the bypass wiring to connect the power application wiring and the bypass wiring to the first connection wiring.

14. The liquid crystal display device of claim 13, further comprising a lamp driving printed circuit board which applies a driving power to the lamp, wherein the power application wiring is electrically connected to the lamp driving printed circuit board with the solder portion.

15. The liquid crystal display device of claim 12, wherein the lower receiving container comprises a lower surface having an aperture through which a portion of the flexible printed circuit board is disposed.

16. The liquid crystal display device of claim 15, wherein the flexible printed circuit board comprises:

a lamp mount portion on which the lamps are mounted; and a terminal portion extending from the lamp mount portion and having the power application wiring s and the bypass wiring disposed at an outer peripheral end portion thereof, and the terminal portion is disposed in the aperture of the lower surface of the lower receiving container.

17. The liquid crystal display device of claim 12, wherein at least one of the first connection wiring and the second connection wiring comprises a via disposed in the base film to connect the power application wiring to the bypass wiring.

18. The liquid crystal display device of claim 12, further comprising a second cover film disposed on the second surface of the base film and the bypass wiring to cover at least a second portion of the second connection wiring, wherein at least a second portion of the first connection wiring is exposed through the second cover film.

19. The liquid crystal display device of claim 18, wherein a distance of the first cover film from a peripheral edge of the base film is different from a distance of the second cover film from a peripheral edge of the base film.

20. The liquid crystal display device of claim 12, wherein at least one of the first connection wiring and the second connection wiring comprises a clip disposed at an outer peripheral edge of the base film to connect the power application wiring to the bypass wiring.

21. The liquid crystal display device of claim 12, wherein an external power is supplied through the bypass wiring when an open circuit occurs at a portion of the power application wiring between the first connection wiring and the second connection wiring, and
the external power sequentially passes through the bypass wiring, the second connection wiring and the power application wiring.

22. The liquid crystal display device of claim 12, wherein the first connection wiring and the second connection wiring are each disposed in separate independent spaced apart respective vias in the base film to connect the power application wiring to the bypass wiring.

* * * * *